United States Patent

Hancock

[11] Patent Number: 5,808,237
[45] Date of Patent: Sep. 15, 1998

[54] ELECTRONICS CASE FOR REDUCING ELECTROMAGNETIC RADIATION

[75] Inventor: Ronald Hancock, Sioux City, Iowa

[73] Assignee: Gateway 2000, Inc., North Sioux City, S. Dak.

[21] Appl. No.: 556,258

[22] Filed: Nov. 13, 1995

[51] Int. Cl.⁶ .................................................. H05K 9/00
[52] U.S. Cl. .................. 174/35 R; 361/683; 361/796; 361/800; 361/816
[58] Field of Search ................ 174/35 R; 361/683, 361/752, 753, 759, 796, 799, 800, 816, 818

[56] References Cited

U.S. PATENT DOCUMENTS

| | | | |
|---|---|---|---|
| 4,804,444 | 2/1989 | Matsuda et al. | 204/28 |
| 4,964,017 | 10/1990 | Jindrick et al. | 361/390 |
| 5,030,793 | 7/1991 | McCarthy | 174/35 |
| 5,138,525 | 8/1992 | Rodriguez | 361/390 |
| 5,239,125 | 8/1993 | Savage et al. | 174/35 |
| 5,276,277 | 1/1994 | Hightower et al. | 174/35 |
| 5,278,351 | 1/1994 | Herrick | 174/35 R |
| 5,354,951 | 10/1994 | Lange, Sr. et al. | 174/35 R |
| 5,495,399 | 2/1996 | Gore et al. | 361/814 |

FOREIGN PATENT DOCUMENTS

| | | |
|---|---|---|
| 0467521A2 | 6/1991 | European Pat. Off. . |
| 93/15595 | 8/1993 | European Pat. Off. . |

*Primary Examiner*—Bot L. Ledynh
*Assistant Examiner*—Hung V. Ngo
*Attorney, Agent, or Firm*—Schwegman, Lundberg, Woessner & Kluth, P.A.

[57] ABSTRACT

An electronic device housing is constructed of multiple connecting panels. The panels are provided with deformations where they contact other panels. The deformations are spaced a distance which is a function of the frequency of the primary electromagnetic radiation emitted by the electronic device to provide positive grounding at that frequency. The housing may be a personal computer housing.

11 Claims, 11 Drawing Sheets

5,808,237

ELECTRONICS CASE FOR REDUCING ELECTROMAGNETIC RADIATION

FIELD OF THE INVENTION

The prevent invention relates to methods and apparatus for reducing radiation emission from an electronics case, and in particular to a case designed to reduce such emission between adjacent touching panels.

BACKGROUND OF THE INVENTION

In the electronics and computer industry today, cases which hold circuitry that create electromagnetic radiation are shielded to prevent emission of radiation. Regulatory bodies set maximum emission levels at various frequencies. Devices failing emission level tests may not be sold. Electronic devices may also need to be shielded from electromagnetic radiation generated by devices outside their cases. In the personal computer (PC) industry, processor speeds are increasing, and are currently above 100 MegaHertz for common consumer devices. Electronic devices, such as PCs must meet strict guidelines in the United States and other countries on the amount of radiation they produce within a given radius. With such high processor speeds, it is getting more and more difficult to ensure that PCs meet the radiation emission guidelines. In addition to the increasing frequency of operation, electronic devices must be manufactured in a cost effective manner to remain profitable.

Personal computers are frequently upgraded in function by users which may require taking apart the computer, adding circuitry, and putting the computer back together. To make this easier for a user to do, most PCs are constructed of mating pieces of sheet metal. It is thought that significant radiation is emitted from the areas where the sheet metal pieces are joined together. A way of preventing such leakage, while still permitting a user to upgrade their systems is needed.

Complex and costly solutions such as shown in U.S. Pat. No. 5,239,125 to Savage et al. where an additional shield is glued in place to cover seams and cracks in surfaces of a shielded structure is disclosed, are too expensive, add additional parts which make the manufacturing process longer, are expensive, and prevent ease of upgrading by a user. There is a need for reducing the radiation emitted from electronics packaging that does not involve additional steps in the assembly of the cases for electronics. In particular, there is a need for reducing the radiation emitted between connecting sheet metal panels which make up the cases of PCs which does not have the shortcomings of existing structures.

SUMMARY OF THE INVENTION

Connecting adjacent panels used to construct cases containing electronic devices are provided with structures to enhance the electromagnetic conductivity between the panels. In one embodiment, dimples on one of the adjacent panels are provided at selected intervals to create protuberances where the panel contacts the other panel when the case is assembled. The dimples provide solid contact points between the two panels.

In one embodiment, the dimples are spaced apart a distance dependent on the primary clock speed of the electronics in the case. In one embodiment, the distance between dimples is about 15 millimeters. The dimples are approximately 0.2 millimeters in depth, creating a corresponding protuberance on the other side of the panel. The panels are formed of sheet metal by common stamping and forming type processes, and the dimples are formed at the time of stamping of the sheet metal. Enhanced shielding of electromagnetic radiation is thus provided with no additional steps added to the manufacturing process. In addition, no extra parts are required, which would add manufacturing steps and expense. A further benefit provided by the dimples is that the sheet metal pieces are easier to assemble and disassemble due to a reduction in friction between the pieces when the are slid together.

The use of the dimples, or other suitable geometric shapes and structures, provides a very repetitive means of establishing good electrical contact. Many electronic devices today, particularly personal computers, are taken apart by users, have features added, and are then reassembled. It is important that the electrical contact provided is repeatably obtained after reassembly. The dimple structures provide such a repeatable contact mechanism.

In a further embodiment, the conductivity enhancing structures are metal tabs stamped out of the sheet metal panels on three sides, with the tabs extending slightly away from the sheet metal towards the mating sheet metal piece. The portion of the tabs still attached to the sheet metal are positioned to come in contact with the mating sheet first during assembly. The remainder of the tab provides a spring force to keep the tab in good electrical contact with the mating sheet.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use. Where multiple similar or identical structures are associated with a reference number, only a few may be labeled in the Figures to avoid clutter.

Figure 1:
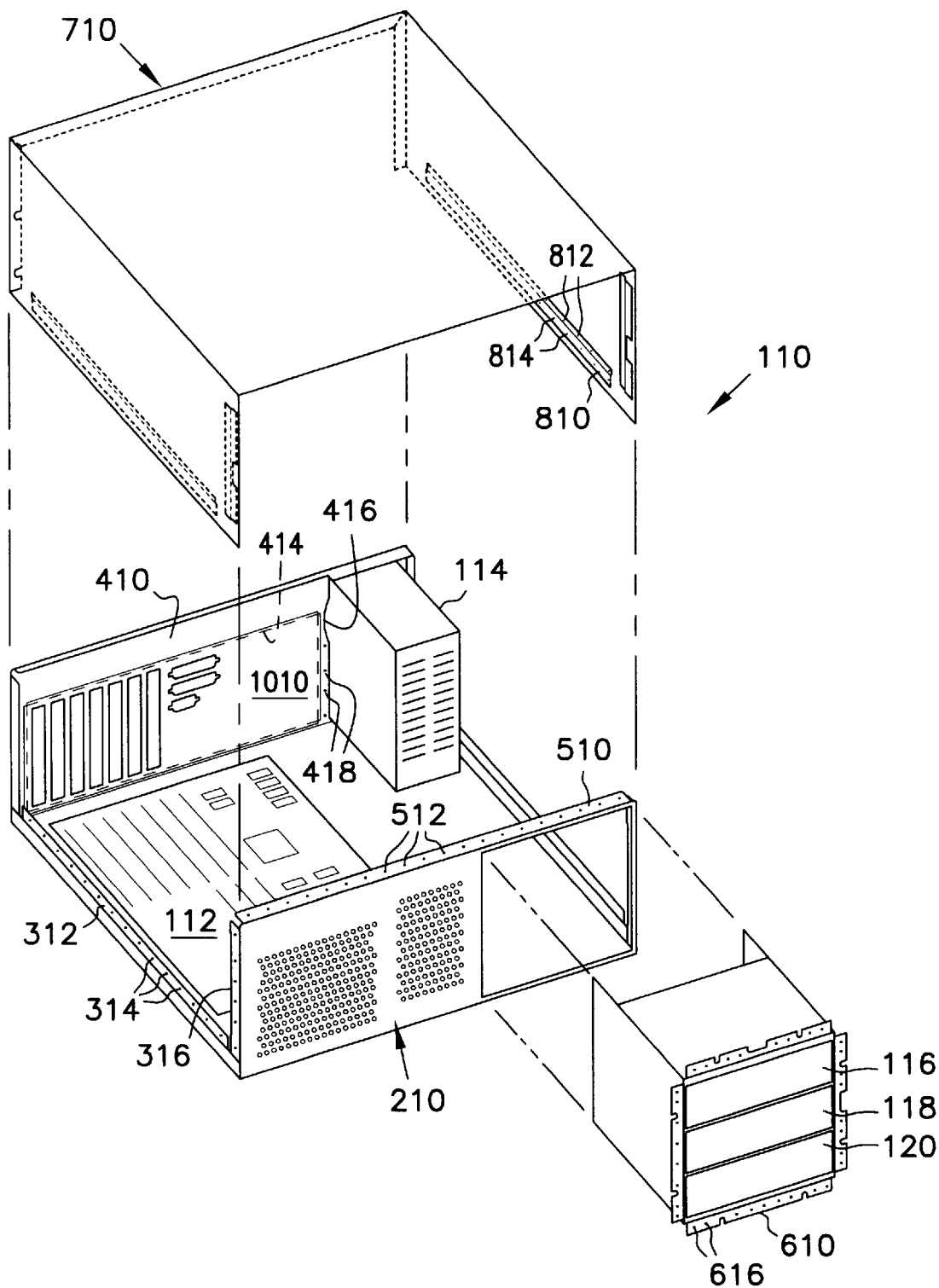
FIG. 1 is an exploded perspective view of a computer system which makes use of the current invention.

A case or housing for a personal computer indicated generally at 110 in FIG. 1 in one embodiment of the present invention is formed from multiple pieces of electrogalvanized steel sheet metal which is coated with zinc. This is a common material used in the industry, and other suitable electromagnetically conductive materials may also be used. The computer comprises a microprocessor residing on a standard system board 112 having dynamic random access memory, slots for optional devices such as modems and sound cards and other common circuitry. In addition, a power supply 114, optical disk drive 116, disk drive 118 and diskette drive 120 are some of the other common components provided as a part of personal computer systems today.

The microprocessor used in many personal computers today currently operates with a clock speed in excess of 100 MegaHertz. In one embodiment, the speed is 133 MHz. It is anticipated that the speeds of such microprocessors will continue to increase in the coming years, and that controlling the emission of electromagnetic interference, EMI, from the personal computer 110 will become more and more difficult. The control of EMI has been considered an extremely complex area of science, almost more of an art, as the manner in which such radiation escapes electronics enclosures has been very difficult to predict, much less control. The present invention employs a consistent and simple device to control such radiation, which is very scalable to different power levels and fundamental frequencies of emission.

Figure 2:
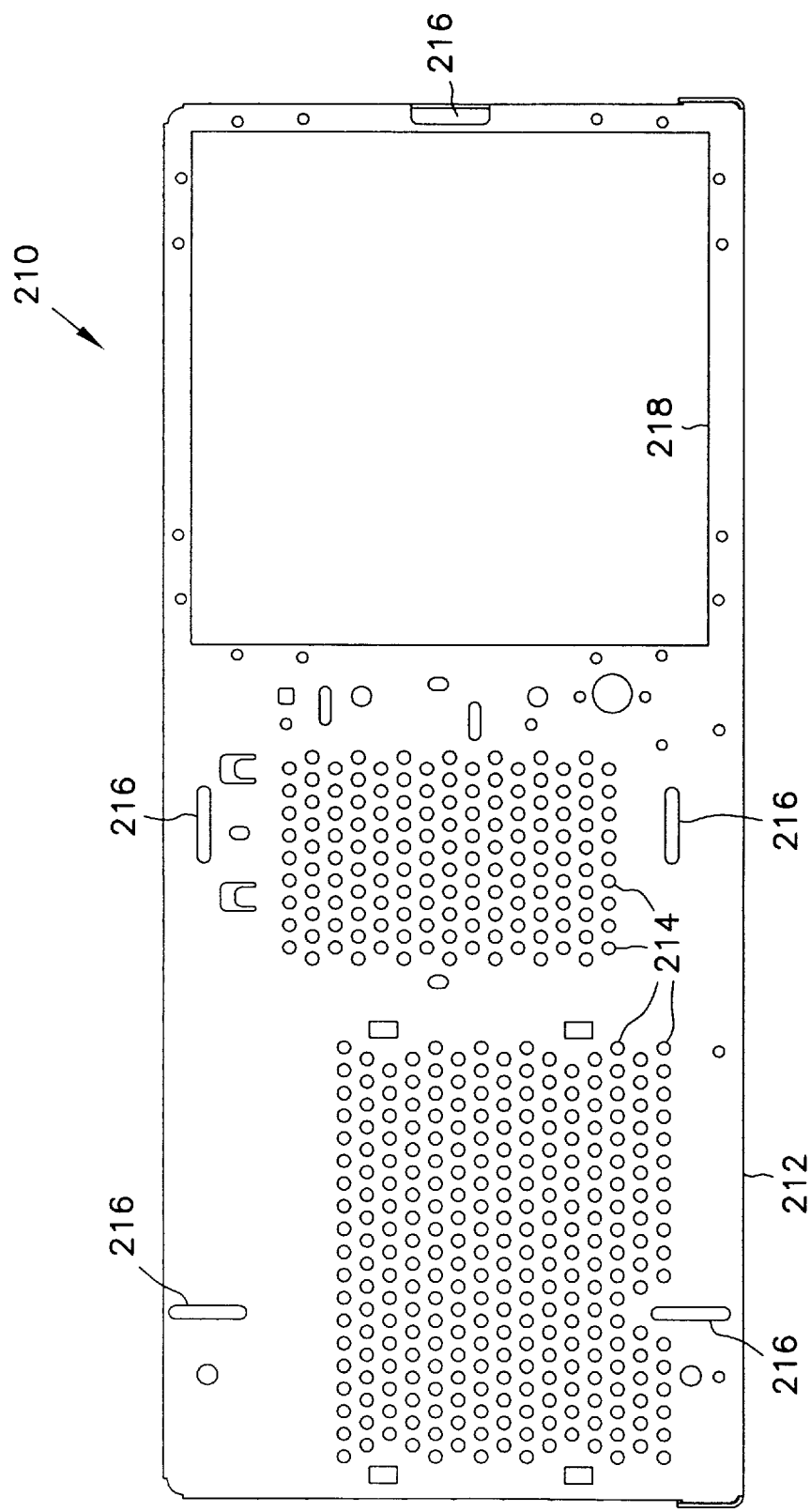
FIG. 2 is a front view of the chassis of the personal computer of FIG. 1.

The case 110 referred to above is formed of a chassis 210 shown in FIGS. 2 through 5 in front, side, rear, and top views respectively. The front of chassis 210 in FIG. 2 is indicated generally at 212, and comprises a plurality of holes 214 for ventilation and cooling of the electronic components within the computer housing. Five elongated openings 216 in the front of chassis 210 accept metal spring clips from a front bezel made of plastic or other material which may be shaped and presented in an aesthetically pleasing manner. The holes and elongated openings do not seem to present a problem with respect to contributing to EMI emissions. They are made small enough to provide their functionality without providing a route for EMI emissions. However, a large square shaped drive bay opening 218 is capable of providing a conduit for EMI emissions. The drive bay 218 is provided in most personal computers for adding features such as disk drives, diskette drives and CD ROM drives. External access to some of the drives which utilize removable memory must be provided. The front of the personal computer is the best place for such devices.

Figure 6:
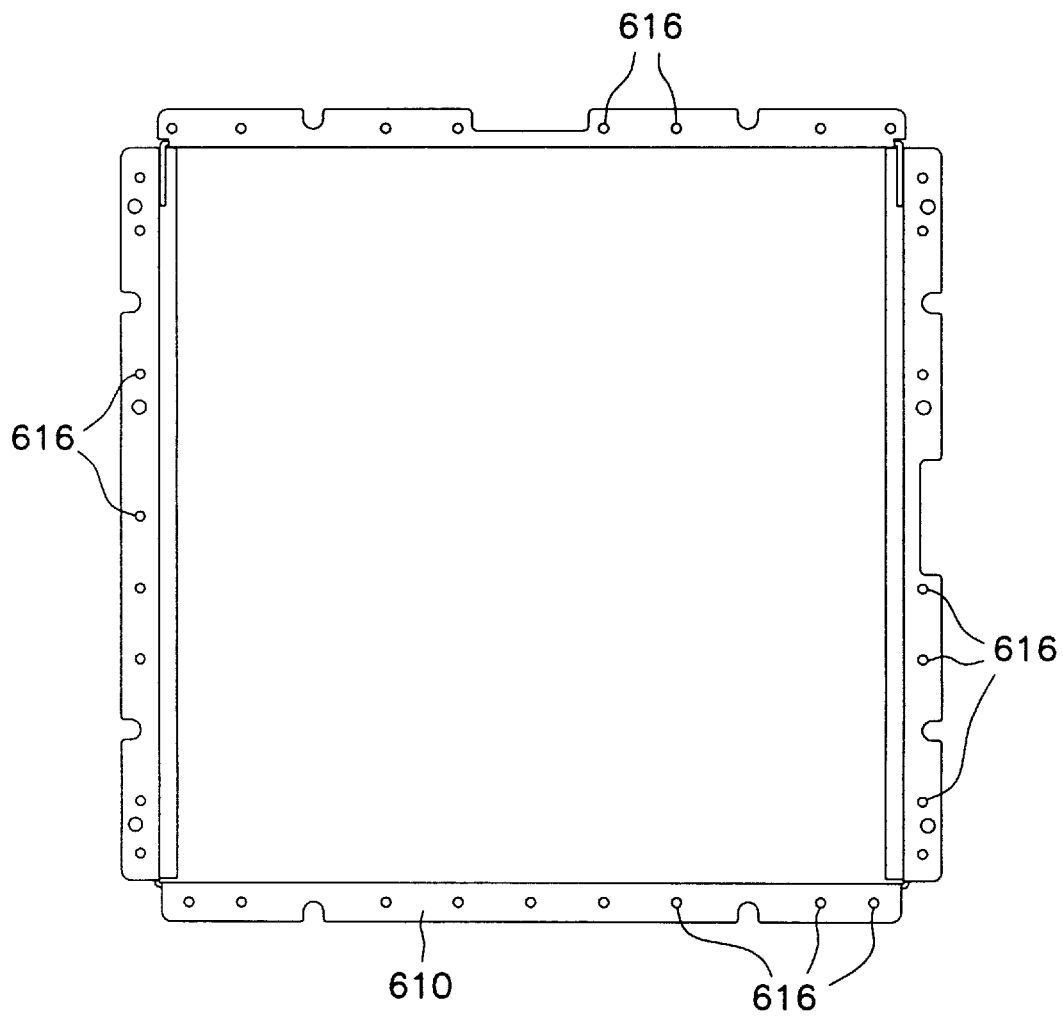
FIG. 6 is a front view of a drive bay bracket with cover for the front of the personal computer chassis of FIG. 1.

In FIG. 6, the front of a drive bracket formed to fit in the square drive bay opening 218 is indicated at 610. The drive bracket itself is provided with metal shields to prevent EMI emanations through the bracket. The bracket 610 also contains suitable openings on sides extending back into the case from the front panel for mating with drives of various sizes. Openings for multiple such drives are provided with replaceable sheets of metal having multiple fingers formed between adjacent sheets to provide protection against EMI emissions. Such stainless steel finger stock is an expensive solution because it requires an extra part, and extra steps to manufacture.

The drive bracket 610 is also provided with flanges 612 on three sides for mating with the front panel, and a similar flange 614 on the fourth side provided by a cover bracket. The cover bracket is attached to the drive bracket by a series of holes and tabs in a common manner. The flanges are provided with a series of structures designed to provide good electromagnetic contact with the front panel when the drive bracket is installed by means of screws or other suitable retentive devices. In one embodiment the structures, or deformations are dimples, some of which are indicated at 616, integrated into the drive bracket and formed during the stamping of the drive bracket. The dimples are spaced in a straight line along the edge of the flanges so that the sides of the flanges where the dimples protrude will contact the front panel. The distance between the dimples appears to be related to the expected fundamental, or primary frequency of the EMI generated by the components within the personal computer. In the case of a Gateway P5 model, 133 Mhz Pentium based personal computer, the distance is approximately 15 millimeters. In one embodiment, the dimples are spaced apart a distance which is approximately ¼ of the wavelength of the fundamental frequency. The spacing of the dimples will vary with the frequency, and is expected to follow a proportional relationship to the primary frequency of the processor. Some amount of experimentation will likely be required to find the best spacing for each system design point. However, given the processor speed, and dimple spacing specified herein, and to be further discussed below, emissions have drastically dropped in computers equipped with dimples on mating, adjacently coupled sheet metal parts, providing a great margin with respect to meeting emissions requirements.

Figure 3:
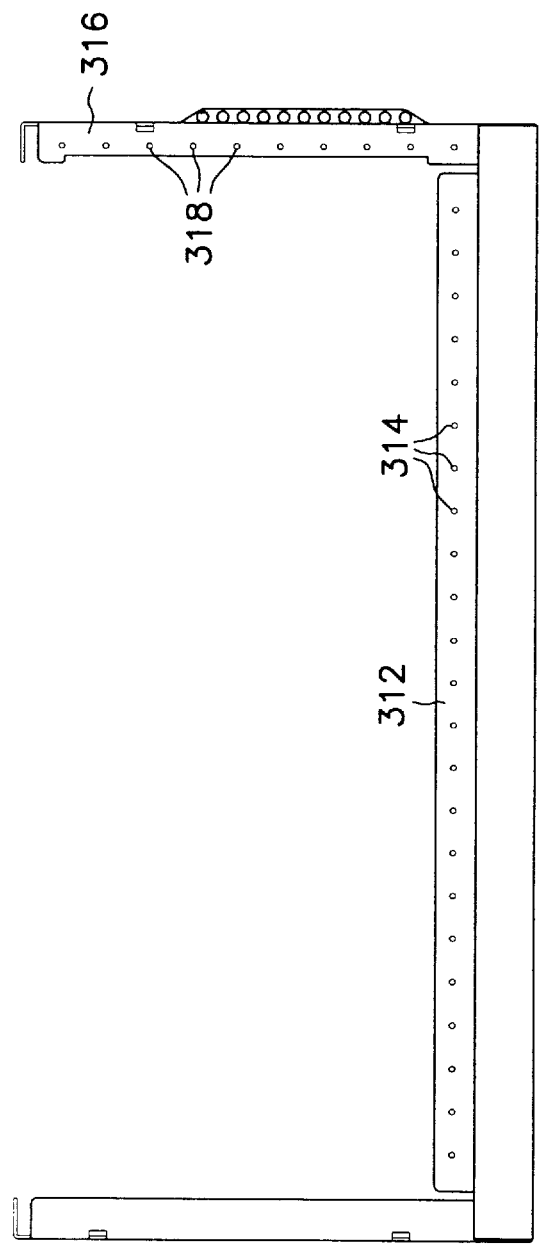
FIG. 3 is a side view of the personal computer chassis of FIG. 1.

A side view of the chassis 210 is shown in FIG. 3. As can be seen from this view, the chassis is "u" shaped, having low sides formed by a flange 312 extending at right angles from a base hidden by the flange. Both sides are formed with an almost identical flange 312. The flange is formed with integrated dimple structures 314, of similar size, depth and spacing to the dimples in the flanges of the drive bracket, running along the length of the chassis. In addition, one can see that each side of the front panel also has a flange 316 extending back into the chassis. Flange 316 is provided with further dimples, some of which are indicated at 318.

Figure 4:
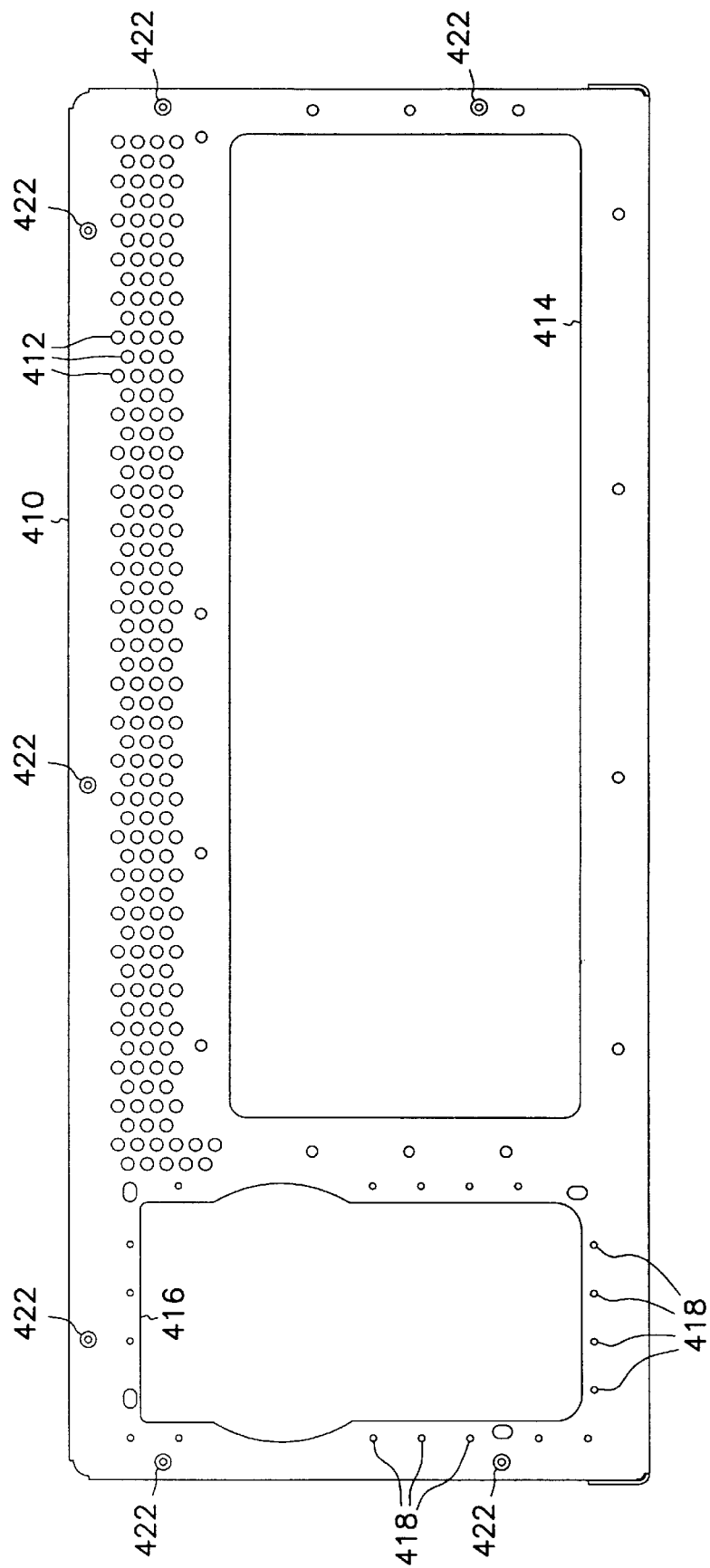
FIG. 4 is a rear view of the personal computer chassis of FIG. 1.

A rear view of chassis 210 is shown in FIG. 4. A rear panel 410 is provided with ventilation holes 412 as is the front panel. In addition, an I/O panel opening 414 is provided for the addition of circuit cards and I/O connectors through the back of the computer. Further, a power supply opening 416 is also provided for insertion of a power supply box into the computer chassis. A row of dimples, some of which are indicated at 418, extending in a line around the power supply opening 416 are formed to extend into the chassis as an integral part thereof, and provide good electromagnetic contact with a metal box that contains the power supply. The dimples 418 in one embodiment are circular, and extend approximately 0.2 millimeters into the computer chassis with a diameter of approximately 2 millimeters. Other sizes of dimples will also provide the positive grounding that is desired. The sizes that will so operate are easily determined by experimentation, and may depend on the thickness of the sheet metal involved, and the frequency of retentive devices used to couple the cover and chassis. In further embodiments, the dimples may be triangular, or of other geometric shape.

Figure 11:
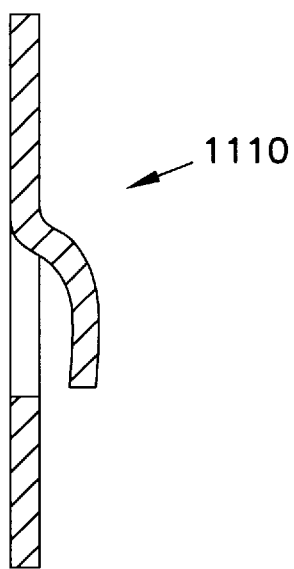
FIG. 11 is a cross section view of a further embodiment of one deformation provided in the parts of the computer system of FIG. 1.

In addition to dimples, small cut out tabs may be used as shown in FIG. 11 at 1110. The tabs are formed of metal stamped out of the sheet metal panels on three sides, with the tabs extending slightly away from the sheet metal towards the mating sheet metal piece a distance approximately the same as the dimples. The portion of the tabs still attached to the sheet metal are positioned to come in contact with the mating sheet first during assembly. The remainder of the tab provides a spring force to keep the tab in good electrical contact with the mating sheet.

The power supply is attached by hex head screws extending through four threaded openings 420 into the power supply to pull the metal box containing the power supply into good electrical contact with each of the dimples 418. Further holes 422 are formed at various intervals near the outside edges of the sides and top of the read panel 410. Holes 422 are formed with suitable threads for receiving screws.

Figure 5:
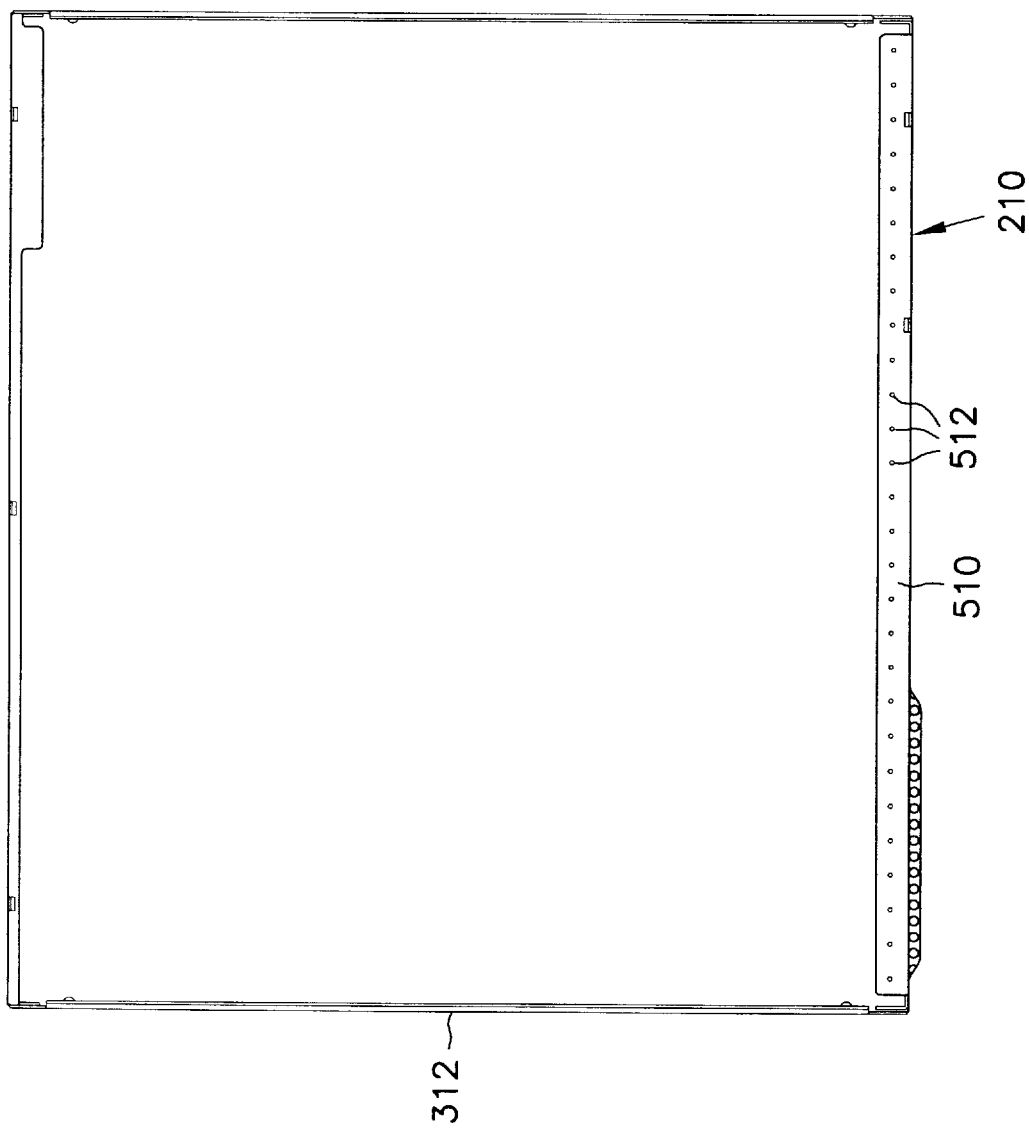
FIG. 5 is top view of the personal computer chassis of FIG. 1.

In FIG. 5, a top view of chassis 210 shows a further flange 510 which is also provided with integrated dimples in a row. The dimples are similar to dimples 418, and are formed during stamping of the chassis 210. The die used for the stamping is preferably formed with appropriate protrusions for forming the dimples or other structures contemplated herein during the stamping. The spacing of the dimples is preferably fairly uniform. However, there will be places in some of the flanges and clips and other pieces where it is not possible to obtain uniform spacing due to either lack of material, or other features that must be provided. In such instances, the pattern is continued as uniform as is practical, taking into account the electrical contact provided by the interrupting structures.

Figure 7:
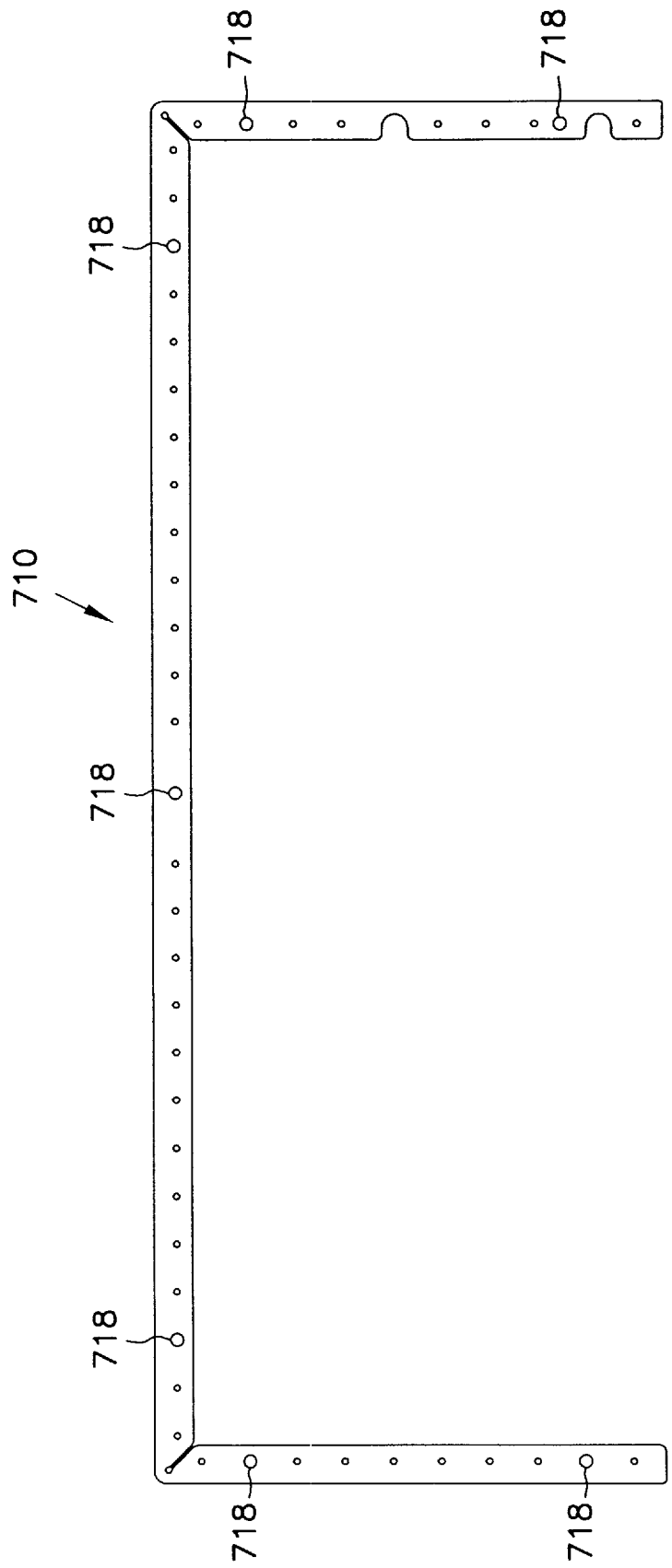
FIG. 7 is a rear view of a mating top cover for the personal computer chassis of FIG. 1.

A rear view of a cover for the chassis is shown generally at 710 in FIG. 7. The cover is a "u" shaped piece of sheet metal formed to mate with the chassis and provide an enclosure for electronics within the enclosure. While a "u" shaped cover and chassis are described, other forms of containers for EMF emitting devices, such as a box and cover may also be provided with dimples to reduce the emission of EMF radiation. The rear of the cover 710 is provided with a top flange 712 and two side flanges 714 and 716 which are further provided with holes 718 which align with holes 422 for attachment of the cover to the chassis with hex head screws. Other means of attachment of the cover to the chassis will be apparent to those skilled in the art, such as clips and latches. No matter the method of attachment, it should provide for quick and easy manufacture, access by users with standard tools, and good repeatable retentive contact for ensuring that a row of dimples 722 extending the length of top flange 712 and side flanges 714 and 716 provide good electrical contact with the rear panel 410. The dimples are about the same size, and spaced apart about the same distance as the dimples in the rear panel 410 about the power supply opening.

Figure 8:
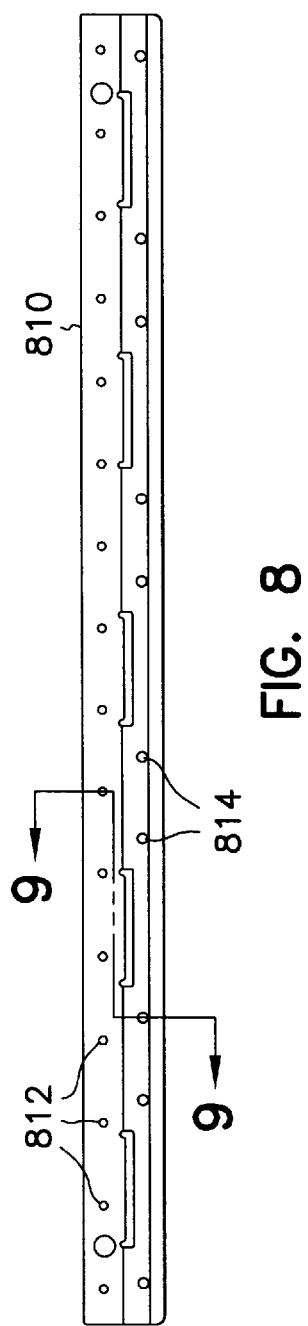
FIG. 8 is a top view of a clip attached to the sides of the top cover of FIG. 7.

The cover 710 has sides which line up with the flanges 312 along the sides of the chassis. As previously noted, the flanges 312 contain dimples 314 which are designed to provide good electrical contact with the cover. Similarly, flange 316 with dimples 318 along the sides of the chassis, and flange 510 with dimples 512 along the top front of the chassis 210 mate with the cover 710. Cover 710 is provided with side and bottom clips 810 as shown in FIG. 8 along each of the edges which are designed to contact the flanges on chassis 210. The clips are provided with a first row of dimples 812 having a diameter of 2 millimeters, and a depth of approximately 0.7 millimeters. The clip is fixed in retentive contact with the edges of the cover, and the first row of dimples pressed against the cover. In one embodiment the clip is spot welded to the cover 710. In another embodiment, it is glued. Other methods of attachment, such as by screws will be readily apparent to one skilled in the art.

Figure 9:
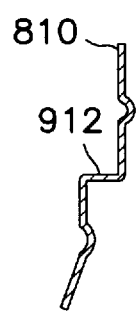
FIG. 9 is a cross sectional view of the clip of FIG. 8 taken along line 9—9.

Clips 810 are provided with a second row of integrated dimples 814 which are slightly larger in diameter, 2.5 millimeters than the first row, but of the same depth. These dimples are formed to contact the flanges of the chassis from the inside of the chassis and form good electrical contact with the chassis. As noted previously, there is insufficient material at all points of the clip to obtain an entirely uniform spacing of dimples. In this embodiment, every third dimple is skipped due to such lack of material. A cross section of the clip along line 9—9 is shown in FIG. 9. As can be seen, the clip has a portion 912 extending out from the portion of the clip attached to the cover in order to mate with the flanges on the chassis. The clip then extends parallel to the flange, and then the dimples 814 are provided. After dimples 814, the clip is bent further away from the flange at an angle of about 20 degrees in order to provide a guide for assembly of the cover with the chassis. The clips are about 0.5 millimeters thick, and formed of a tempered steel for providing an adequate spring force to keep the dimples 814 in retentive contact with the chassis.

By providing dimples along the points of the chassis and cover and cover where the contact each other, reduced EMI is just one benefit. When the chassis and cover are assembled, the cover 710 is placed a little to the rear of the chassis so that it may slide forward on the flange 312 so that the side clips 810 come into contact with the flanges 316 on the front sides of the chassis 210. Prior to the provision of dimples, large expanses of sheet metal were in direct sliding contact with each other, creating a large amount of friction which had to be overcome to complete the assembly. Damage may have been caused when users forced the chassis and cover together or apart. With the dimples, relatively few point contacts provide much less friction, allowing less force to be used to fully engage the cover and chassis. This added benefit provided by the dimples makes assembly and disassembly much easier than before, with less likelihood of damage to components. when users try to force the chassis and cover together or apart.

Figure 10:
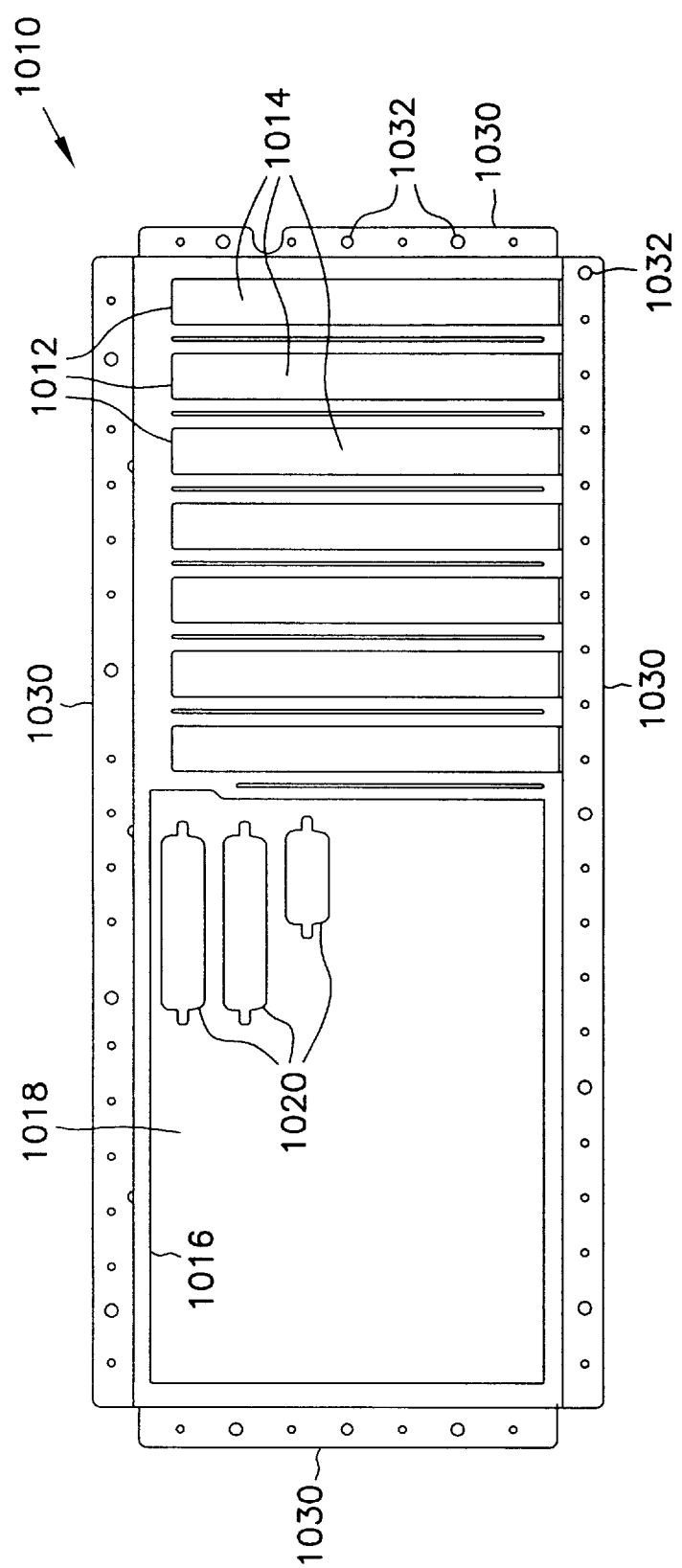
FIG. 10 is a front view of an I/O panel for the rear of the personal computer chassis of FIG. 12

In FIG. 10, an I/O panel insert is shown generally at 1010. Insert 1010 fits in the larger opening of the back panel and is attached by screws in one embodiment. The insert 1010 is provided with multiple openings 1012 for the metal ends of circuit cards 1014, and multiple screw holes for fastening the cards to the chassis. The cards plug into a system board for providing optional equipment for the computer, such as modems, game cards, accelerator cards and other well known options. The side of the insert which is on the inside of the chassis when installed contains steel fingerstock for providing good electrical contact for the metal ends of the circuit cards. A large I/O opening 1016 is provided for allowing the feed through of various connectors for communicating signals into and out of the chassis 210 other than through cards. A further metal plate 1018 containing desired connector openings 1020 is inserted into the I/O opening 1016, which is also provided with finger stock, and is screwed into place in a manner similar to the circuit cards. Both the plate 1018 and the metal ends of the circuit cards are provided with tabs opposite the screw holes for insertion into slots near the bottom of the chassis to hold them tightly against the spring biased finger stock when screwed into place.

The I/O panel insert 9100 is provided with flanges 1030 on all four sides perpendicular to the panel. The flanges 1030 are provided with dimples 1032 substantially equally spaced where possible. Again, the dimples are preferably formed during stamping of the insert, and are 2 millimeters in diameter, and have a depth of approximately 0.2 millimeters extending downward to contact the inside of the back panel of chassis 210. The I/O panel insert is coupled to the back panel by means of rivets. Multiple rivet holes 1032 are provided for that purpose. Other means of connecting the insert to the panel will be apparent to those skilled in the art. By coupling the panel insert to the back panel with the dimples contacting the back panel, excellent EMI emission prevention is accomplished.

It is to be understood that the above description is intended to be illustrative, and not restrictive. Many other embodiments will be apparent to those of skill in the art upon reviewing the above description. A computer or other electronics housing or case has been described which is formed of multiple pieces of sheet metal. The particular size and fitting of the sheet metal pieces may vary significantly from that described and still remain within the scope of the present invention. Where adjacent pieces contact each other, deformations, such as dimples which may be round or of other geometry such as triangular, square, or a multitude of other shapes, provide for good electrical contact. While particular spacing and sizes of the dimples have been specified, it will be apparent to those skilled in the art that other spacing and sizes will also provide appropriate protection against EMI emission. The dimples were described mainly as being integrated into the parts of the case. It is also clear to those skilled in the art that the dimples or other structures may be provided as additional parts, similar to the clips, which may be appropriate fastened to the sheet metal pieces of the case. The sheet metal pieces of the case may also be made of other materials that conduct electromagnetic radiation such as plastic which contains conductive material. It is contemplated that with changes in processor and clock speeds, the fundamental frequency of the radiation may change and require different dimple spacing and size which may or may note follow a linear relationship with the frequency of radiation. Such changes are considered to be well within the scope of the invention as claimed.

What is claimed is:

1. A personal computer housing, comprising:
   a chassis, formed of an electromagnetic conductive material, for holding personal computer electronic devices;
   a cover, formed of an electromagnetic conductive material and shaped to conform to and couple to the chassis for enclosing the electronic devices; and
   a plurality of deformations provided in at least one of the chassis and the cover where edges of the chassis and the cover are coupled together to provide a conductive path between the chassis and the cover to reduce the amount of electromagnetic radiation emitted from the housing, wherein the chassis has a first opening formed therein for attaching a power supply, and wherein the first opening is provided with further deformations which contact the power supply to provide a conductive path between the chassis and the power supply to reduce the amount of electromagnetic radiation emitted from the housing.

2. The personal computer housing of claim 1, and further comprising:
   a second opening formed in the chassis;
   a bracket formed to fit into the second opening for attaching external devices to the personal computer housing; and
   a plurality of deformations formed on at least one of the bracket and the second opening for providing a conductive path between the chassis second opening and the bracket to reduce the amount of electromagnetic radiation emitted from the housing.

3. The personal computer housing of claim 1 and further comprising a clip, coupled to one of the cover and the chassis having a plurality of deformations formed therein, said clip being positioned to contact an edge of the other one of the cover and the chassis when the chassis and the cover are coupled.

4. The personal computer housing of claim 1 wherein at least one of the cover and the chassis is formed of electro-galvanized steel sheet metal coated with zinc.

5. The personal computer housing of claim 1 wherein the deformations comprise dimples formed to protrude into the edges of one of the cover and chassis when coupled together.

6. The personal computer housing of claim 5 wherein the dimples are spaced apart a distance which is approximately ¼ of the wavelength of the fundamental frequency of the electromagnetic radiation produced by the electronic devices contained in the chassis.

7. The personal computer housing of claim 5 wherein the dimples are spaced apart a distance of approximately 15 millimeters.

8. The personal computer housing of claim 5 wherein the dimples are approximately 0.2 millimeters in depth.

9. The personal computer housing of claim 1 wherein the deformations comprise tabs formed to protrude into adjacent surfaces of the cover and the chassis when coupled together.

10. The personal computer housing of claim 9 wherein a portion of the tabs attached to the cover and the chassis is positioned to come into contact with the mating adjacent surface first during assembly of the cover and the chassis.

11. The personal computer housing of claim 1 wherein the electronic devices comprise a personal computer having a power supply, disk drive, microprocessor and memory.

* * * * *